(12) United States Patent
Shibata

(10) Patent No.: US 7,399,387 B2
(45) Date of Patent: Jul. 15, 2008

(54) TARGET FOR SPUTTERING AND A METHOD FOR MANUFACTURING A MAGNETIC RECORDING MEDIUM USING THE TARGET

(75) Inventor: Kazuyoshi Shibata, Nagano (JP)

(73) Assignee: Fuji Electric Device Technology Co., Ltd., Tokyo (JP)

(*) Notice: Subject to any disclaimer, the term of this patent is extended or adjusted under 35 U.S.C. 154(b) by 806 days.

(21) Appl. No.: 10/854,800

(22) Filed: May 27, 2004

(65) Prior Publication Data
US 2005/0011746 A1    Jan. 20, 2005

(30) Foreign Application Priority Data
Jun. 18, 2003    (JP)    ............................ 2003-173873

(51) Int. Cl.
*C23C 14/34*    (2006.01)
(52) U.S. Cl. ........................ 204/192.2; 204/298.12; 204/298.18
(58) Field of Classification Search .............. 204/192.2, 204/298.12, 298.13, 298.18, 298.28
See application file for complete search history.

(56) References Cited

U.S. PATENT DOCUMENTS
6,143,149 A * 11/2000 Abe ..................... 204/298.26

FOREIGN PATENT DOCUMENTS
| JP | 01-227224 | * | 9/1989 |
| JP | 07-057237 | * | 3/1995 |
| JP | 2001-014664 |   | 1/2001 |

OTHER PUBLICATIONS
Machine Translation of 07-057237 dated Mar. 1995.*

* cited by examiner

*Primary Examiner*—Rodney G McDonald
(74) *Attorney, Agent, or Firm*—Rabin & Berdo, P.C.

(57) ABSTRACT

A target for sputtering includes a sputtering material layer having tilt surfaces. Sputtering material particles are emitted from the tilt surfaces in directions of their normals. Consequently, even though the target and a substrate are arranged approximately parallel and the axes of the two are coincident with each other, the particles are injected onto the substrate from oblique directions.

20 Claims, 9 Drawing Sheets

TARGET FOR SPUTTERING AND A METHOD FOR MANUFACTURING A MAGNETIC RECORDING MEDIUM USING THE TARGET

BACKGROUND OF THE INVENTION

1. Field of the Invention

The invention relates to a target for sputtering used in manufacturing a magnetic recording medium, and to a method for manufacturing a magnetic recording medium using such a target.

2. Background Art

The surface recording density of hard disk media has continued to increase. A medium with a recording density of as high as 70 Gb/in$^2$ has been commercialized. The increased recording density, however, is accompanied by a problem of thermal instability of recording bits. In addition, media noise should be reduced.

To achieve thermal stability and reduced media noise, methods have been tried in which magnetic anisotropy is given to a magnetic layer of a magnetic disk medium. One of the methods forms a texture that is a pattern of convex and concave lines, on a nonmagnetic substrate of the magnetic disk medium, and deposits material on the textured substrate surface to provide magnetic anisotropy in the circumferential direction of the disk.

Some other methods give the magnetic anisotropy to a magnetic layer of the disk by tilting the direction of incident particle beam from the target to the substrate.

Japanese Unexamined Patent Application Publication No. 2001-14664 discloses a method in which a mask having slits with one of various shapes is placed between the target and the substrate. The particles sputtered on the target travel through slits or holes of the mask in which only the particles with a defined tilt (angular direction) reach the substrate, so that planar anisotropy is given to the deposited magnetic layer.

Figure 9A:
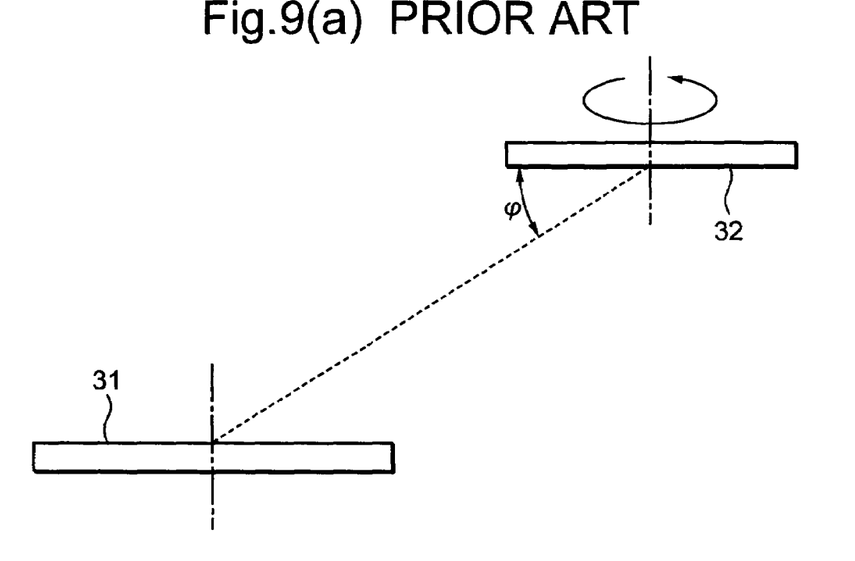
Figure 9B:
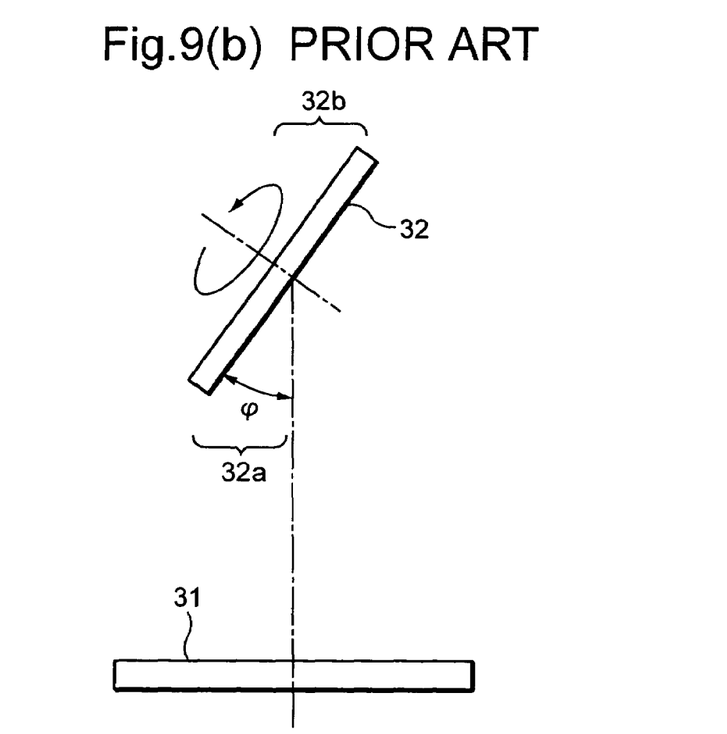

Japanese Unexamined Patent Application Publication No. H7-057237 discloses a method of tilting the incident angle of particles from a target to a substrate. This method is illustrated in FIGS. 9(a) and 9(b) of the present drawings. In the relative positions of a target 31 and a substrate 32 shown in FIG. 9(a), the axes of the two are displaced, keeping the axes in parallel from an original arrangement in which the surfaces of the two disks are parallel and the two axes are coincident, so that the incident angle is tilted from a right angle to an angle φ. In the relative positions shown in FIG. 9(b), the axis of a substrate 32 is tilted from the original arrangement to an angle φ.

A so-called perpendicular recording system is now extensively studied for improving thermal stability and enhancing recording density in which magnetization is perpendicular to the magnetic layer plane. Also being studied is a so-called longitudinal recording system in which magnetization is along the track direction, which is a principal scanning direction. The perpendicular recording system particularly involves a problem of noise from a soft magnetic layer of a recording medium. A possibility has been suggested that this type of noise can be reduced by giving the soft magnetic film anisotropy in a circumferential or radial direction. In a perpendicular recording medium with coercivity higher than 7 kOe, the writing process becomes difficult because the magnetic field intensity generated by the write head is not enough to treat that high coercivity. This problem can be addressed by reducing the coercivity by growing magnetic particles of the recording layer in a tilted direction rather than in a right angle direction, and tilting the major axis of the magnetic particles. Thus, tilting the direction of the incident particle beam to the substrate is useful in a perpendicular recording system as well.

The above-described method, which uses a mask, however, involves a problem that only a fraction of the total of emitted particles reach the substrate by traveling through the slits or holes in the mask. Therefore, the deposition speed of the magnetic film is slow, the performance of the film is not satisfactory, and the deposition process takes a long time. Since the particles trapped on the mask are useless, the efficiency of target utilization is low. Consequently, one target allows the production of only a small number of substrates. Since the particles attached to the mask may become harmful dust, frequent cleaning of the mask is required. These unfavorable facts increase the costs of manufacturing recording media.

In the method, to tilt one of the axes of the target and relative to that of the substrate as shown in prior art FIG. 9(b), nearer portion 32a is situated with a smaller distance between the substrate and the target, while farther portion 32b is situated with a larger distance between them. Thus, a large difference in the distance to the target occurs on the substrate surface. As a result, a homogeneous film cannot be deposited. The efficiency of target utilization is also low. By the method to shift the relative positions of the axes of the target and the substrate as shown in prior art FIG. 9(a), many particles do not enter the substrate and are useless, resulting in a low efficiency of target utilization. In addition, the above-described methods cannot give magnetic anisotropy in a circumferential direction of the substrate.

OBJECT AND SUMMARY OF THE INVENTION

The invention has been made in view of the above problems and an object of the invention is to solve the problems accompanied by the use of a mask, and to provide means to attain homogeneous deposition of a magnetic film and high efficiency of target utilization.

A first embodiment of the invention is a target for sputtering having an approximately disk shape. The target comprises a sputtering material layer in an axially end portion of the target. The sputtering material layer comprises three or more tilt surfaces tilted by a specified angle with respect to a plane perpendicular to a center axis of the target.

In the target for sputtering of the first embodiment of the invention, the sputtering material particles are emitted from the tilt surface of the sputtering material layer in a direction normal to the tilt surface, which direction is different from the direction of the center axis of the target. Consequently, even though the target and the substrate are arranged approximately parallel to each other, and the axes of the two are coincident with each other, the particles can be injected into the substrate from an oblique direction. Since the first embodiment of the invention does not need a mask, problems accompanying the use of the mask have been solved. Further, as compared with a method in which a target and a substrate are tilted with respect to each other, the distances between the points on the target and the points on the substrate do not scatter very much. Therefore, homogeneous deposition and high efficiency of target utilization can be achieved.

A second embodiment of the invention is a target for sputtering according to the first embodiment, wherein the tilt surface is tilted in a circumferential direction with respect to the plane perpendicular to the center axis of the target. In the target for sputtering of the second embodiment, when the target and the substrate are relatively rotated, the distance between the tilt surface and the substrate surface varies, so that every point on the substrate surface equally faces high and low positions on the tilt surface. Consequently, the deposited film becomes further homogeneous.

A third embodiment of the invention is a target for sputtering of the second embodiment, wherein the tilt surface includes a radial segment of the target. In the target for sputtering of the third embodiment, a projection of the normal to the tilt surface is directed approximately along a circumferential direction of the target. When the target and the substrate are arranged and opposed with the axes of the two being coincident with each other, the particles discharged from the tilt surface inject onto the substrate in a direction that is oblique with respect to the substrate and has a projection extending in the circumferential direction of the substrate. Therefore, magnetic anisotropy in the circumferential direction can be achieved for the substrate.

Provided the overall dimension of the target in the axial direction is fixed, if the target has a larger number of the tilt surfaces, then a larger tilt angle of the tilt surfaces is possible, which in turn, allows a larger incident angle of the particle beam onto the substrate. Therefore, an embodiment of the invention that provides three or more tilt surfaces is advantageous.

A fourth embodiment of the invention is a target for sputtering according to any one of the first through third embodiments, wherein each of the tilt surfaces is a divided partition of a sector form. The fourth embodiment favorably achieves the effects of the first to third embodiments of the invention.

The plurality of tilt surfaces as defined in the fourth embodiment can be formed such that adjacent tilt surfaces are tilted to the same direction with respect to the plane perpendicular to the center axis of the target, as in a fifth embodiment of the invention, or alternatively, tilted to opposite direction as in a sixth embodiment.

A seventh embodiment of the invention is a method for manufacturing a magnetic recording medium comprising a sputtering step, wherein particles of sputtering material are injected into the substrate from the target, for sputtering defined by any one of the first through sixth embodiments of the invention. The seventh embodiment favorably achieves the effects of the targets of the first to sixth embodiments.

An eighth embodiment of the invention is a method for manufacturing a magnetic recording medium according to the method of the seventh embodiment, wherein the target and the substrate are relatively rotated around the center axis during the step of sputtering. The rotation of the target in the eighth embodiment allows the particles discharged from the target equally to deposit onto the substrate to obtain a homogeneous deposition film.

The seventh and eighth embodiments can be applied to desired thin film formation selecting a wide range of appropriate sputtering materials. The method of the invention can be employed in the formation of a soft magnetic layer as in a ninth embodiment. The method of the invention also can be employed in the formation of a magnetic recording layer as in tenth embodiment or in the formation of an underlayer constituting a magnetic recording medium as in an eleventh embodiment. The method of the invention additionally can be employed in the formation of an intermediate layer constituting a magnetic recording medium as in twelfth embodiment of the invention, and in the formation of other types of thin films.

BRIEF DESCRIPTION OF DRAWINGS

FIG. 9($a$) and FIG. 9($b$) are side views showing conventional methods for manufacturing a magnetic recording medium.

DETAILED DESCRIPTION OF PREFERRED EMBODIMENTS

Figure 1:
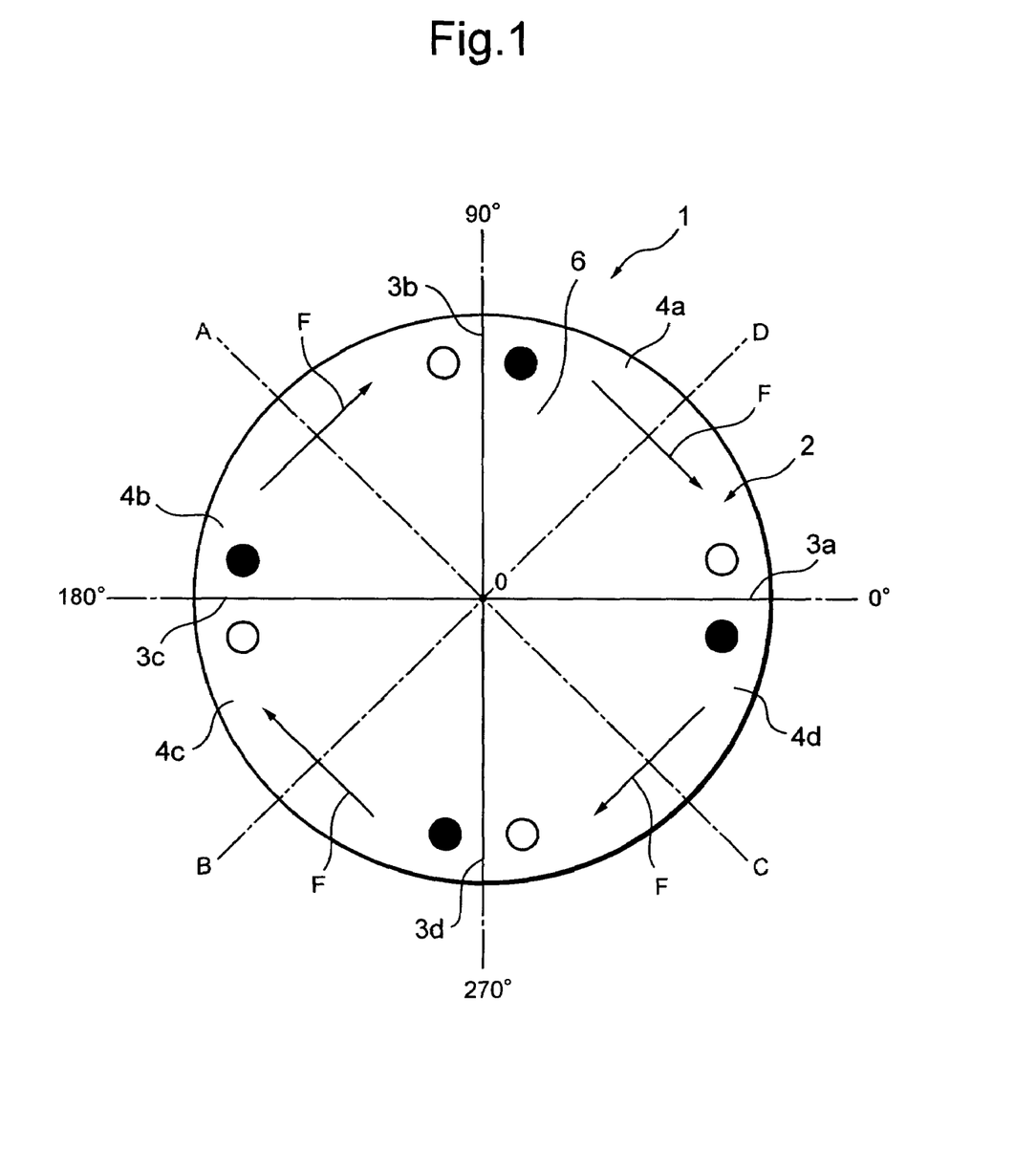
FIG. 1 is a plan view of a target of a first embodiment of the invention.

Now, preferred embodiments of the invention will be described in detail with reference to the accompanying drawings. Referring to FIG. 1, a target 1 for sputtering according to a first embodiment of the invention has an approximately disk shape. A surface 2 at the end of the target in the axial direction is divided into four portions. Each boundary of the adjacent portions is an edge line 3$a$, 3$b$, 3$c$, or 3$d$. The four portions are arranged in rotational symmetry, each having an equal area and a sector shape.

Each of the four portions of the end surface 2 of the disk has a tilt surface 4$a$, 4$b$, 4$c$, or 4$d$. Each tilt surface is roughly planar and tilts around a radius A-O, B-O, C-O, or D-O, which is a line segment perpendicular to the center axis and extends from the center axis to the circumferential arc boundary. The radii A-O, B-O, C-O, and D-O are at right angles to the adjacent ones. The tilt makes the parts marked with a black circle higher than the parts marked with a white circle.

Figure 2:
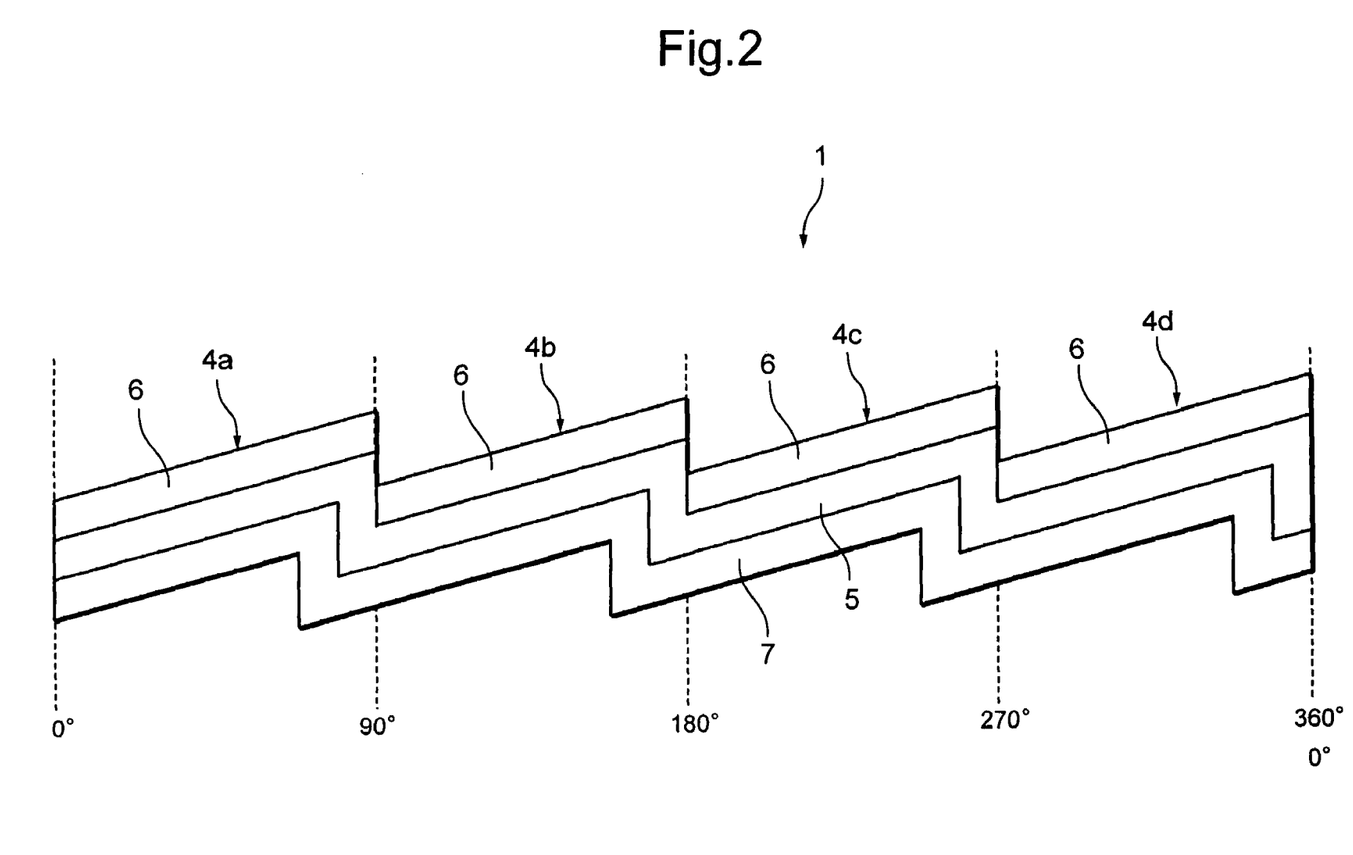
FIG. 2 illustrates the peripheral side surface of a target of the first embodiment.
Figure 3:
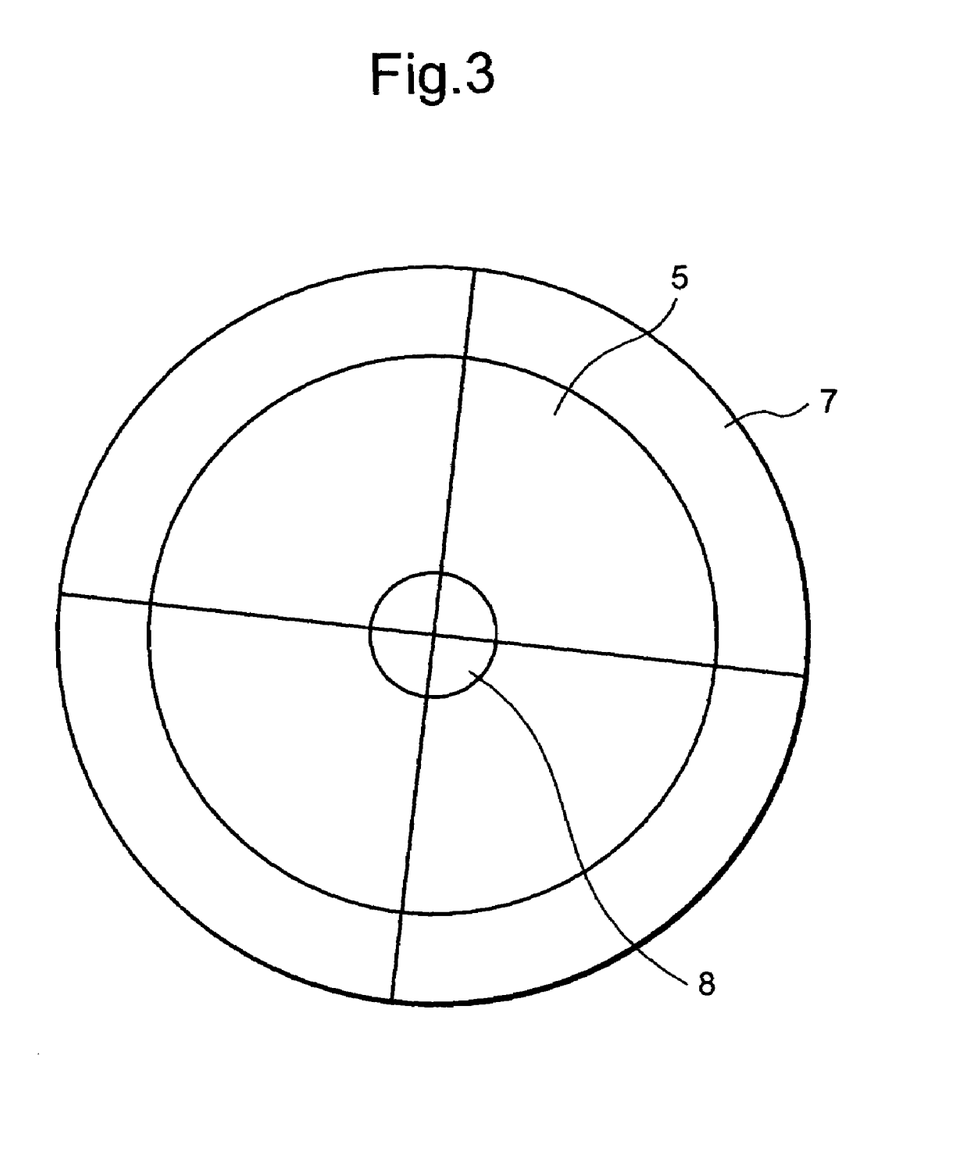
FIG. 3 illustrates a bottom plane of a target of the first embodiment of the invention.

As shown in FIG. 2, the target 1 comprises a backing plate 5 formed of copper, for example, a sputtering material layer 6 fixed to the front surface of the backing plate 5, and a peripheral permanent magnet 7 fixed on the rear surface of the backing plate 5. The peripheral magnet 7 has a ring shape and is fixed on the peripheral portion of the rear surface of the backing plate 5 as shown in FIG. 3. A central permanent magnet 8 also is fixed at the central portion of the rear surface of the backing plate 5. The peripheral magnet 7 and the central magnet 8 effectively perform a so-called magnetron sputtering operation, which is a method for enhancing sputtering efficiency by revolving electrons with the aid of the magnetic field generated by the permanent magnets. The backing plate 5 is manufactured by press working a flat copper plate. The manufacturing method allows the sputtering material layer 6 and the peripheral magnet 7, which are fixed on the front and rear surfaces, respectively, to be disposed approximately parallel to each other. As a result, the surface magnetic field intensity at the sputtering material layer 6 is approximately constant in the circumferential direction.

Figure 4:
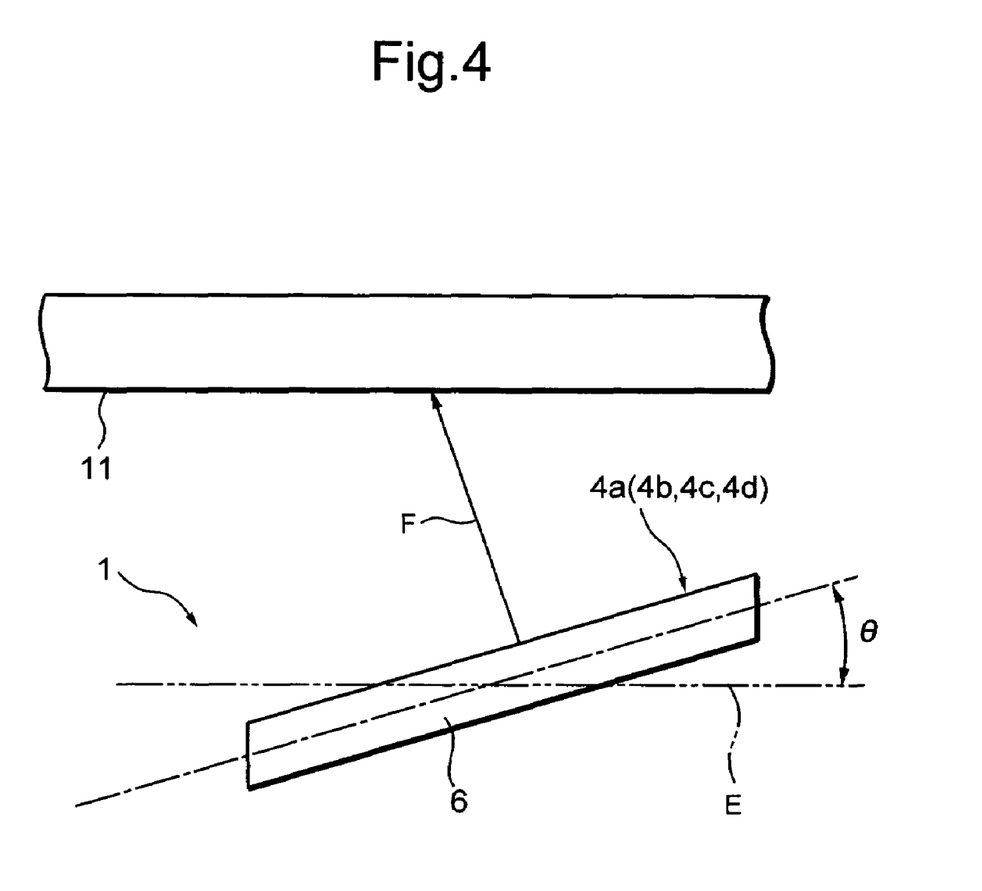
FIG. 4 is a side view schematically showing a tilt surface of a target of the first embodiment.

The sputtering material layer 6 and the surfaces thereof (tilt surfaces 4$a$, 4$b$, 4$c$, and 4$d$), are tilted by a specified tilt angle θ with respect to a plane E perpendicular to the center axis of the target 1, as shown in FIG. 4. The tilt angle θ may have any value except zero. A preferable tilt angle θ is in the range of 10° to 45°. A projection of a normal F of each tilt surface on the plane E is approximately in the circumferential direction of the target 1 as shown in FIG. 1. Strictly speaking, the projection is exactly in the circumferential direction on the radius A-O, B-O, C-O or D-O.

Figure 5:
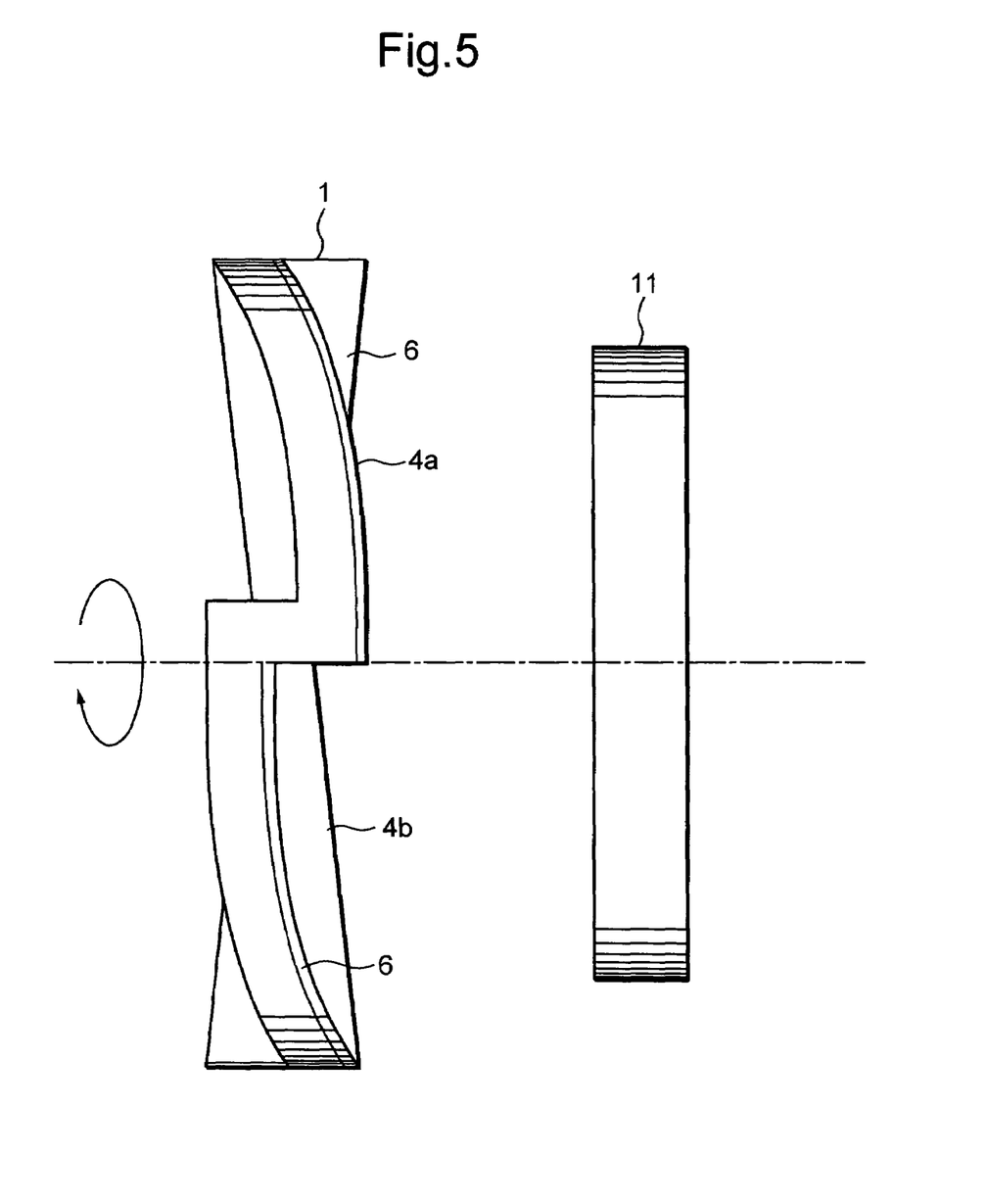
FIG. 5 is a side view schematically showing a sputtering step using a target of the first embodiment of the invention.

A method is described in the following for manufacturing a hard disk medium using a target 1 according to the first embodiment, which has the structure described above. Referring to FIG. 5, a target 1 and a nonmagnetic substrate 11 are arranged approximately in parallel in a vacuum chamber filled with argon gas, and the axes of the target and substrate are coincident. Sputtering is conducted by applying a high dc or ac voltage to the target 1. The target 1 is rotated about its center axis during the sputtering process.

The sputtering material layer 6 in this embodiment includes tilt surfaces 4a, 4b, 4c, and 4d. Consequently, the sputtering material particles are emitted from the tilt surfaces of the sputtering material layer 6 in directions about normal to the respective tilt surfaces. The direction is different from the direction of the center axis of the target 1, and is indicated by the arrow F in FIG. 1 (representing the normal to the surface). Even though the target 1 and the substrate 1 are arranged approximately parallel and the axes of the two are coincident with each other, the particles can be injected into the substrate 11 in oblique directions, which are indicated by the arrow F in FIG. 4. Since this embodiment does not need a mask for deflecting the direction of incident particle beam as described above in connection with the prior art, the problems accompanied by the use of the mask have been solved. Further, as compared with the method in which the target 1 and the substrate 11 are arranged to be shifted or tilted with respect to each other, the distances between the points on the target 1 and the points on the substrate do not scatter very much. Therefore, homogeneous deposition and high efficiency of target utilization can be achieved.

The tilt surfaces 4a, 4b, 4c, and 4d in this embodiment are tilted in the circumferential direction with respect to the plane perpendicular to the axis of the target 1, such that the height of the tilt surface, which is in a position in the direction of the axis of the target 1, varies along the circumferential direction of the target 1. Accordingly, when the target 1 and the substrate 11 are relatively rotated, the distance between the tilt surface of the target and the substrate surface varies periodically. Thus, every point on the substrate equally faces towards high and low positions in the axial direction on the tilt surface. Consequently, the particles are evenly injected onto the substrate 11 and the deposited film becomes further homogeneous.

Provided the overall axial extent of the target 1 is fixed, a larger number of tilt surfaces or a larger number of divisions of the end surface 2 of the target allows larger tilt angle θ of the tilt surfaces, which in turn, allows larger incident angle of the particle beam onto the substrate 11. Therefore, this embodiment, which has three or more tilt surfaces in an end surface in the axial direction of the target 1, is basically advantageous. The first embodiment allows any number of divisions larger than or equal to three of the target end surface. However, an excessively large number of division causes difficulties in machining the backing plate 5 and forming the magnets 7 and 8. A number of divisions in the range of four to ten is appropriate for practical applications.

A target 1 according to this embodiment of the invention has three or more tilt surfaces that are divided by the radial edge lines 3a, 3b, 3c, and 3d and have sector shapes. During relative rotation of the target 1 and the substrate 11, the distance between the tilt surface and the substrate varies and the points on the tilt surface farther from the substrate and nearer to the substrate equally face the substrate. Therefore, homogeneous deposition can be achieved. Since the tilt surface is approximately planar and includes a segment of the radius of the target 1, a projection of the normal of the tilt surface is directed in the circumferential direction of the target. As a result, the particles discharged from the tilt surface inject onto the substrate 11 in a direction that is oblique with respect to the substrate, and the projection of the particle beam on a plane perpendicular to the center axis extends in the circumferential direction of the substrate. Therefore, magnetic anisotropy can be given to the substrate in the circumferential direction, which is the principal scanning direction of a completed hard disk medium.

A sputtering material layer 6 according to this embodiment of the invention is formed by fixing pieces having roughly sector and planar form on the backing plate 5. However, any other method may be employed that provides effects of the invention. For example, the sputtering material layer 6 may be formed as a single monolithic member and fixed to the backing plate.

Figure 6:
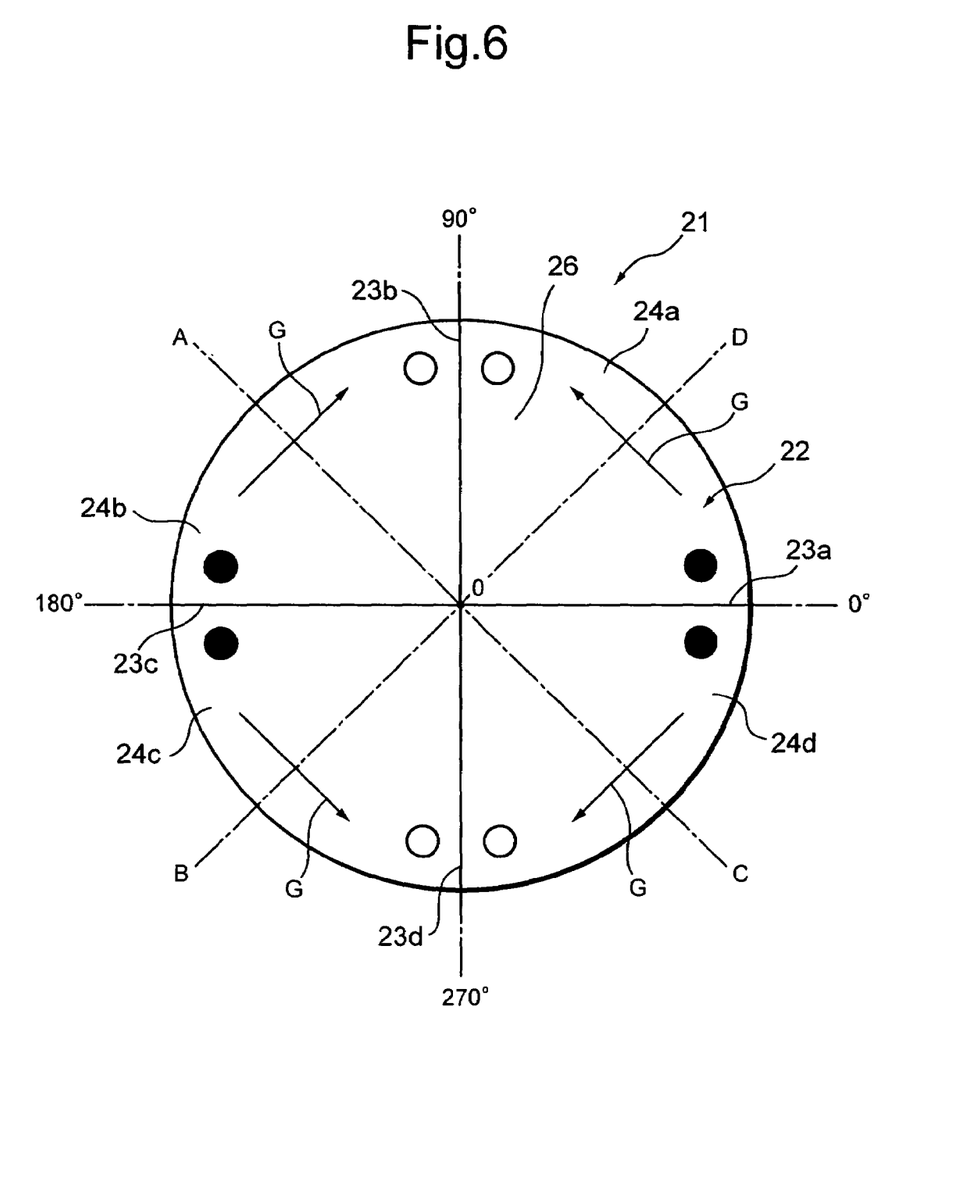
FIG. 6 is a plan view of a target of the second embodiment.

A second embodiment of the invention will be described below. Referring to FIG. 6, a target 21 for sputtering of the second embodiment has an approximately disk shape. An end surface 22 in the axial direction is divided by boundary lines 23a, 23b, 23c, and 23d in the radial direction of the target 21 to form four portions that have equal areas of sector shape, and a rotational symmetry.

Tilt surfaces 24a, 24b, 24c, and 24d (each referred to as a tilt surface 24) are formed on the four divided portions. The tilt surfaces 24 are approximately planar and respectively tilted along the radii A-O, B-O, C-O, and D-O, each perpendicular to the adjacent radius. The tilt makes the part marked with a black circle higher than the part marked with a white circle in FIG. 6. The number of divisions in the second embodiment of the invention is any even number larger than or equal to four. The larger number of divisions allows a larger tilt angle θ of the tilt surface 24 and may be favorable. However, an excessively large number of divisions causes difficulties in working the backing plate and forming the magnets. A number of divisions in the range of four to ten is appropriate for practical applications.

Figure 7:
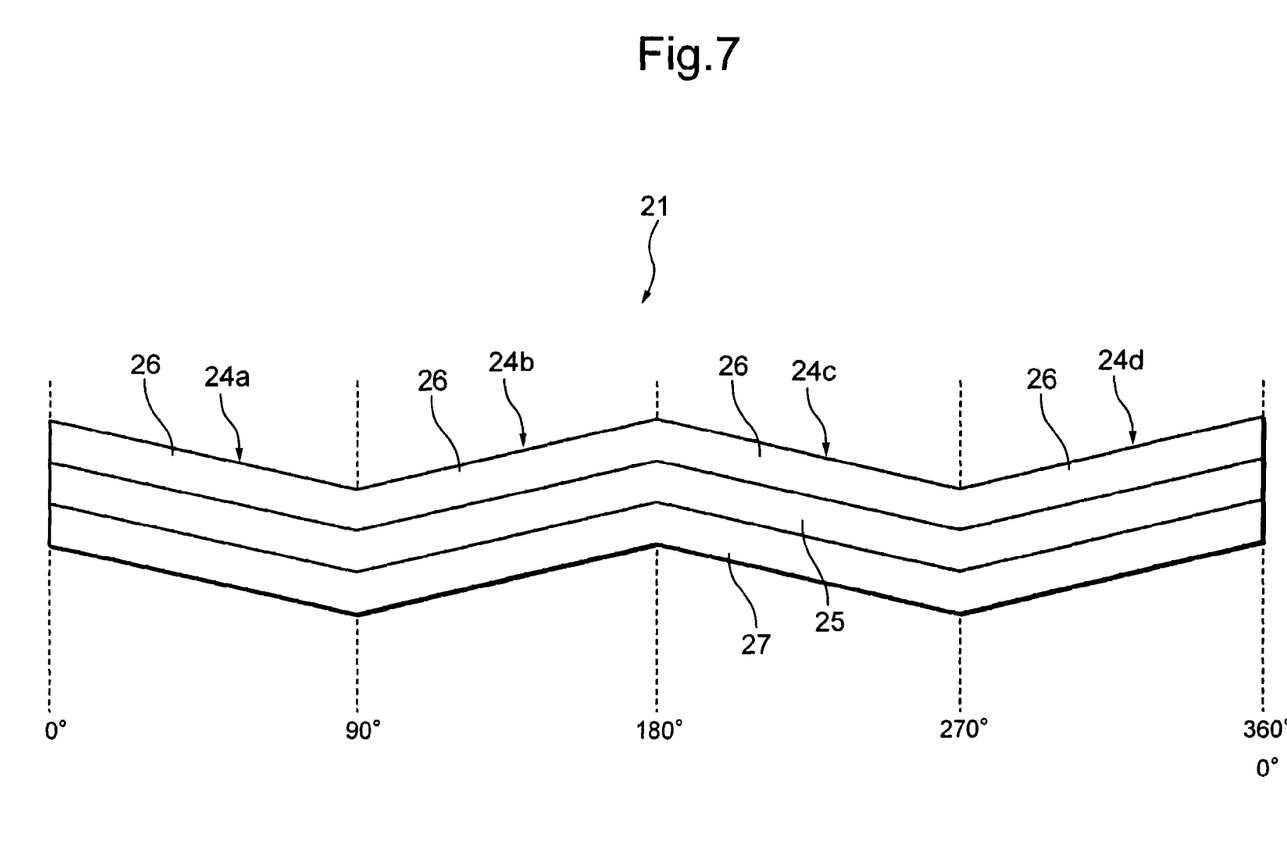
FIG. 7 illustrates the peripheral side surface of a target of the second embodiment of the invention.

Referring to FIG. 7, the target 21 comprises a backing plate 25, a sputtering material layer 26 fixed to the front surface of the backing plate, and permanent magnets, including a permanent peripheral magnet 27 and a permanent central magnet (not shown), fixed to the rear surface of the backing plate 25. The sputtering material layer 26 is monolithic, being formed by pressing a disk shape material so that the tilt surfaces 24a, 24b, 24c, and 24d are joined together to form one continuous member. Alternatively, the members forming the tilt surfaces can be individually formed and then fixed to the backing plate. Any other method may be employed to form the tilt surfaces as may allow the effects of the invention to be obtained.

Figure 8:
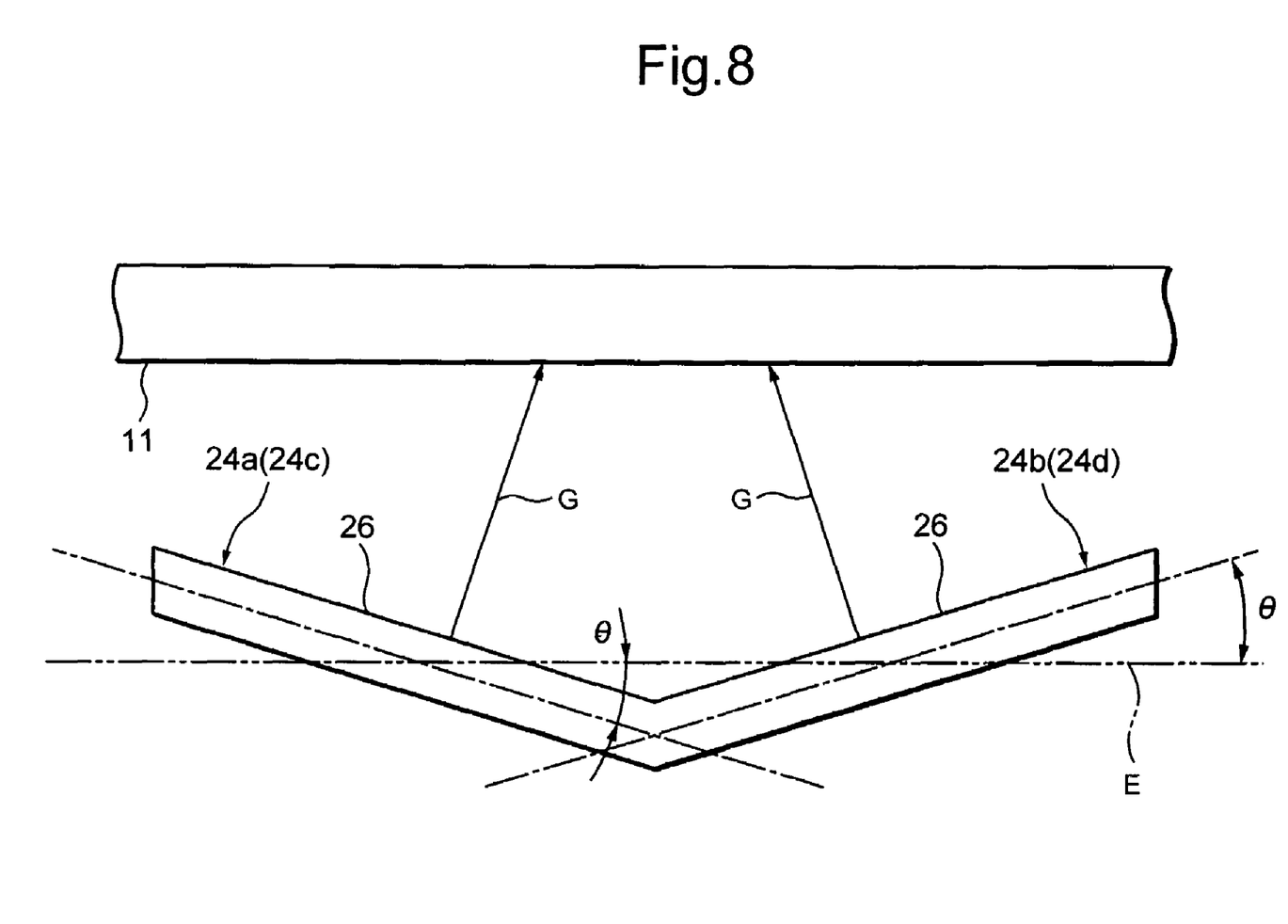
FIG. 8 is a side view schematically showing a tilt surface of a target of the second embodiment.

Each portion of the sputtering material layer, and the surfaces thereof, which are tilt surfaces 24, are tilted by a specified angle θ or −θ with respect to the plane (surface) E that is perpendicular to the axis of the target, as shown in FIG. 8. The projections of normals G of the tilt surfaces 24 on the plane E of the target 1 are elongated in the circumferential direction of the target 1, as shown in FIG. 6. Other structures in the second embodiment of the invention are the same as in the first embodiment.

The second embodiment of the invention has an advantage in addition to the effects of the first embodiment, in that the sputtering material layer 26 having tilted surfaces 24a, 24b, 24c, and 24d is readily formed and assembled as a single monolithic member. It is further advantageous that the arrangement of the peripheral magnet 27 and central magnet (not shown in the figure) is readily provided since the magnetic field generated by the peripheral and central magnets is uncomplicated.

The target 1 and target 21 are rotated during the sputtering process in the first and second embodiments of the invention. Relative rotation of the target 1 or 21 with respect to the substrate 11 is sufficient in the invention. The target 1 and the target 21 may be at rest while the substrate 11 is rotated, for example. Instead, the target and the substrate may be rotated in opposite direction, or the two may be rotated in the same direction but at different speeds. In the embodiments of the invention, although the target and the substrate are arranged with the central axes of the two being coincident, the axes of the two may be shifted or tilted by a certain amount. Even so, the effects of the invention are fairly preserved.

Sputtering material for the sputtering material layer 6, 26 can be selected from a wide variety of materials and can be applied for forming a desired thin layer of the target of these embodiments. Targets according to the invention can be widely applied to a soft magnetic layer, a magnetic recording layer, an under-layer, an intermediate layer that constitute a magnetic recording medium, and other types of thin layers. Substances described below in connection with examples of embodiments, and other substances, can be employed for the target.

In the embodiments described above, the end surface in the axial direction is divided entirely from the periphery to the center. Since the steps between adjacent sectors are small in the central portion of the target 1, 21, the central portion may not be divided and a boss with a cylindrical shape may be formed. The tilt surfaces are approximately planar in the embodiments of the invention described above. However, the tilt surface in the invention may be a curved surface, and any appropriate form of surface may be employed for obtaining desired magnetic anisotropy. A base body composing the substrate 11 can be a glass base, an aluminum alloy base, or other commonly used base body.

SPECIFIC EXAMPLES

Specific examples of the embodiments of the invention are described below.

Example 1

A magnetic recording medium was manufactured using a target 1 of the first embodiment of the invention and a sputtering material layer 6 of CoCrPtB. The tilt angle $\theta$ was 15°. A substrate 11 was constructed by laminating a chromium layer, a chromium alloy layer, a CoCrPtB layer, and a carbon protective film in this order on a glass base body. The magnetic recording medium was of a longitudinal recording type. The target 1 was rotated at 1 rps during deposition of the CoCrPtB layer. The CoCrPtB layer was deposited to a thickness of 20 nm in 6 seconds. Coercivity Hc of the resultant magnetic recording medium was 4.3 kOe in the circumferential direction and 3.9 kOe in the radial direction.

Example 2

A magnetic recording medium was manufactured using a target 21 of the second embodiment of the invention and a sputtering material layer 26 of CoCrPtB. The tilt angle $\theta$ was 15°. A substrate 11 was constructed by laminating a chromium layer, a chromium alloy layer, a CoCrPtB layer, and a carbon protective film in this order on a glass base body. The magnetic recording medium was of a longitudinal recording type. The target 21 was rotated at 1 rps during deposition of the CoCrPtB layer. The CoCrPtB layer was deposited to a thickness of 20 nm in 6 seconds. Coercivity Hc of the resultant magnetic recording medium was 4.3 kOe in the circumferential direction and 3.9 kOe in the radial direction.

Example 3

A magnetic recording medium was manufactured using a target with six divisions. The target was a variation of the second embodiment of the invention. The sputtering material layer 26 was composed of CoCrPtB. The tilt angle $\theta$ was 15°. A substrate 11 was constructed by laminating a chromium layer, a chromium alloy layer, a CoCrPtB layer, and a carbon protective film in this order on a glass base body. The magnetic recording medium was of a longitudinal recording type. The target was rotated at 1 rps during deposition of the CoCrPtB layer. The CoCrPtB layer was deposited to a thickness of 20 nm in 6 seconds. Coercivity Hc of the resultant magnetic recording medium was 4.4 kOe in the circumferential direction and 3.8 kOe in the radial direction.

Example 4

A magnetic recording medium was manufactured using a target with six divisions. The target was a variation of the second embodiment. The sputtering material layer 26 was composed of CoCrPtB. The tilt angle $\theta$ was 25°. A substrate 11 was constructed by laminating a chromium layer, a chromium alloy layer, a CoCrPtB layer, and a carbon protective film in this order on a glass base body. The magnetic recording medium was of a longitudinal recording type. The target was rotated at 1 rps during deposition of the CoCrPtB layer. The CoCrPtB layer was deposited to a thickness of 20 nm in 6 seconds. Coercivity Hc of the resultant magnetic recording medium was 4.6 kOe in the circumferential direction and 3.6 kOe in the radial direction.

Example 5

A magnetic recording medium was manufactured using a target with six divisions. The target was a variation of the second embodiment of the invention. The sputtering material layer 26 was composed of CoCrPtB. The tilt angle $\theta$ was 25°. A substrate 11 was constructed by laminating a chromium layer, a chromium alloy layer, a CoCrPtB layer, and a carbon protective film in this order on a glass base body. The magnetic recording medium was of a longitudinal recording type. The substrate 11, in place of the target, was rotated at 1 rps during deposition of the CoCrPtB layer. The CoCrPtB layer was deposited to a thickness of 20 nm in 6 seconds. Coercivity Hc of the resultant magnetic recording medium was 4.6 kOe in the circumferential direction and 3.6 kOe in the radial direction.

Example 6

A magnetic recording medium was manufactured using a target with six divisions. The target was a variation of the second embodiment of the invention. The sputtering material layer 26 was composed of CoCrPtB. The tilt angle $\theta$ was 25°. A chromium alloy layer was deposited using a tilted target that has the same shape as the CoCrPtB target, but comprises a sputtering material layer 26 composed of a chromium alloy. A substrate 11 was constructed by laminating a chromium layer, a chromium alloy layer, a CoCrPtB layer, and a carbon protective film in this order on a glass base body. The magnetic recording medium was of a longitudinal recording type. The targets were rotated at 1 rps during deposition of the CoCrPtB layer and during deposition of the chromium alloy layer. The CoCrPtB layer was deposited to a thickness of 20 nm in 6 seconds and the chromium alloy layer was deposited to a thickness of 10 nm in 6 seconds. Coercivity Hc of the resultant magnetic recording medium was 4.6 kOe in the circumferential direction and 3.3 kOe in the radial direction.

Example 7

A magnetic recording medium was manufactured using a target with six divisions. The target was a variation of the second embodiment. The sputtering material layer 26 was composed of CoCrPtB. The tilt angle θ was 25°. A substrate 11 was constructed by laminating a CoZrNb layer, a titanium alloy layer, a CoCrPtB layer, and a carbon protective film in this order on a glass base body. The magnetic recording medium was of a perpendicular recording type. The target was rotated at 1 rps during deposition of the CoCrPtB layer. The CoCrPtB layer was deposited to a thickness of 25 nm in 6 seconds. Coercivity Hc of the resultant magnetic recording medium was 4.6 kOe in the perpendicular direction. An SNR, an R/W characteristic, was 13 dB at 400 kFCI. A comparative example using a flat target resulted in a coercivity of Hc=5.9 kOe and an SNR of 10 dB.

Example 8

A soft magnetic layer of a perpendicular magnetic recording medium was manufactured using a target with six divisions. The target was a variation of the second embodiment of the invention. The sputtering material layer 26 was composed of CoZrNb. The tilt angle θ was 25°. A substrate 11 was constructed by laminating a CoZrNb layer and a carbon protective film in this order on a glass base body. The target was rotated at 1 rps during deposition of the CoZrNb layer, which was amorphous. Coercivity Hc of the resultant CoZrNb film was 240 Oe in the circumferential direction and 8 Oe in the radial direction.

Example 9

A soft magnetic layer of a perpendicular magnetic recording medium was manufactured using a target with six divisions. The target was a variation of the second embodiment. The sputtering material layer 26 was composed of CoFeB. The tilt angle θ was 25°. A substrate 11 was constructed by laminating a CoFeB layer and a carbon protective film in this order on a glass base body. The target was rotated at 1 rps during deposition of the CoFeB layer, which was crystalline. Coercivity Hc of the resultant CoFeB film was 290 Oe in the circumferential direction and 6 Oe in the radial direction.

Example 10

A magnetic recording medium was manufactured using a target with six divisions. The target was a variation of the second embodiment of the invention. The sputtering material layer 26 was composed of CoZrNb. The tilt angle θ was 25°. A substrate 11 was constructed by laminating a CoZrNb layer, a titanium alloy layer, a CoCrPtB layer, and a carbon protective film in this order on a glass base body. The magnetic recording medium was of a perpendicular recording type. The target was rotated at 1 rps during deposition of the CoZrNb layer. The CoZrNb layer was deposited to a thickness of 200 nm in 30 seconds. An SNR, an R/W characteristic, was 14 dB at 400 kFCI. A comparative example using a flat target of CoZrNb resulted in an SNR of 11 dB.

Example 11

A magnetic recording medium was manufactured using a target with six division. The target was a variation of the second embodiment. The sputtering material layer 26 was composed of CoCrPtB. The tilt angle θ was 25°. A titanium alloy layer was deposited using a tilted target that has the same shape as the CoCrPtB target, but comprises a sputtering material layer 26 composed of a titanium alloy. A substrate 11 was constructed by laminating a CoZrNb layer, a titanium alloy layer, a CoCrPtB layer, and a carbon protective film in this order on a glass base body. The magnetic recording medium was of a perpendicular recording type. The targets were rotated at 1 rps during deposition of the titanium alloy layer and during deposition of the CoCrPtB layer. The titanium alloy layer was deposited to a thickness of 20 nm in 6 seconds and the CoCrPtB layer was deposited to a thickness of 25 nm in 6 seconds. Coercivity Hc of the resultant magnetic recording medium was 4.4 kOe in the perpendicular direction. An SNR, an RAW characteristic, was 13 dB at 400 kFCI. A comparative example using a flat target resulted in a coercivity Hc=5.9 kOe and an SNR of 10 dB.

The first embodiment of the invention has solved the problems accompanied by the use of a mask because no mask is necessary. Further, as compared with a method in which a target and a substrate are arranged tilted with respect to each other, the distances between the points on the target and the points on the substrate do not scatter very much. Therefore, homogeneous deposition and high efficiency of target utilization can be achieved.

When the target and the substrate are relatively rotated as in the second embodiment, the distance between the tilt surface and the substrate varies so that every point on the substrate surface equally faces to the positions on the tilt surface at locations nearer to and farther from the substrate. Therefore, the deposited film becomes further homogeneous.

In the third embodiment of the invention, projections of the normals of the tilt surfaces on a plane perpendicular to the center axis of the target are directed along directions of the circumference of the target. When the target and the substrate are arranged in opposition with the axes of the two coincident with each other, the particles discharged from the tilt surfaces inject onto the substrate in directions that are oblique with respect to the substrate and have projections extending along the circumference of the substrate. Therefore, magnetic anisotropy in the circumferential direction can be given to the substrate.

Provided the axially extending overall dimension of the target is fixed, a larger number of tilt surfaces of the target allows a larger tilt angle of the tilt surfaces, which in turn, allows a larger incident angle of the particle beam onto the substrate. Therefore, the embodiments of the invention that provide three or more tilt surfaces are advantageous.

The fourth through twelfth embodiments of the invention favorably achieve the effects of the first through third embodiments. The application incorporates by reference the entire disclosure of the applicant's corresponding Japanese Patent Application No. 2003-173873, filed Jun. 18, 2003.

What is claimed is:

1. A target for sputtering, which has a shape which is approximately a disk shape, which includes a top surface and a peripheral side surface, and which comprises:
a backing plate; and
a sputtering material layer provided on the backing plate and having at least three tilt surfaces which are tilted by a specified angle with respect to a plane perpendicular to a center axis of the target when viewed from the peripheral side surface of the target.

2. The target for sputtering according to claim 1, wherein each of the plurality of tilt surfaces is a divided partition having a sector form.

3. The target for sputtering according to claim 1, wherein each tilt surface of the at least three tilt surfaces is tilted in a circumferential direction with respect to the plane perpendicular to the center axis of the target.

4. The target for sputtering according to claim 3, wherein each of the plurality of tilt surfaces is a divided partition having a sector form.

5. The target for sputtering according to claim 3, wherein each tilt surface of the at least three tilt surfaces includes a segment of a radius of the target.

6. The target for sputtering according to claim 5, wherein each of the plurality of tilt surfaces is a divided partition having a sector form.

7. The target for sputtering according to claim 6, wherein adjacent tilt surfaces of the at least three tilt surfaces are tilted in the same direction with respect to the plane perpendicular to the center axis of the target.

8. The target for sputtering according to claim 6, wherein adjacent tilt surfaces of the at least three tilt surfaces are tilted in the opposite direction with respect to the plane perpendicular to the center axis of the target.

9. A method for manufacturing a magnetic recording medium using a target for sputtering, comprising the steps of: providing a target for sputtering which has a shape which is approximately disk shape, which includes a top surface and a peripheral surface, and which comprises a backing plate: and a sputtering material layer provided on the backing plate and having at least three tilt surfaces which are tilted by a specified angle with respect to a plane perpendicular to a center axis of the target when viewed from the peripheral side surface of the target; and sputtering under conditions effective therefore so that particles of sputtering material are injected to a substrate from the target.

10. The method for manufacturing a magnetic recording medium according to claim 9, wherein a magnetic recording layer is formed in the step of sputtering.

11. The method for manufacturing a magnetic recording medium according to claim 9, wherein an under-layer is formed in the step of sputtering.

12. The method for manufacturing a magnetic recording medium according to claim 9, wherein an intermediate layer is formed in the step of sputtering.

13. The method for manufacturing a magnetic recording medium according to claim 9, wherein a soft magnetic layer is formed in the step of sputtering.

14. The method for manufacturing a magnetic recording medium according to claim 9, wherein the target and the substrate are rotated relative to one another around the center axis during the step of sputtering.

15. The method for manufacturing a magnetic recording medium according to claim 14, wherein a magnetic recording layer is formed in the step of sputtering.

16. The method for manufacturing a magnetic recording medium according to claim 14, wherein an intermediate layer is formed in the step of sputtering.

17. The method for manufacturing a magnetic recording medium according to claim 11, wherein a soft magnetic layer is formed in the step of sputtering.

18. The method for manufacturing a magnetic recording medium according to claim 17, wherein an under-layer is formed in the step of sputtering.

19. The method for manufacturing a magnetic recording medium according to claim 9, wherein, in the target for sputtering provided, each of the plurality of tilt surfaces is a divided partition having a sector form.

20. The method for manufacturing a magnetic recording medium according to claim 9, wherein adjacent tilt surfaces of the at least three tilt surfaces are tilted in one of (a) the same direction with respect to the plane perpendicular to the center axis of the target or (b) in the opposite direction with respect to the plane perpendicular to the center axis of the target.

* * * * *